United States Patent
Lee et al.

(10) Patent No.: US 6,735,116 B2
(45) Date of Patent: May 11, 2004

(54) NAND-TYPE FLASH MEMORY DEVICE WITH MULTI-PAGE PROGRAM, MULTI-PAGE READ, MULTI-BLOCK ERASE OPERATIONS

(75) Inventors: Yeong-Taek Lee, Seoul (KR); Young-ho Lim, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/322,268

(22) Filed: Dec. 17, 2002

(65) Prior Publication Data

US 2003/0117851 A1 Jun. 26, 2003

(30) Foreign Application Priority Data

Dec. 24, 2001 (KR) .................................. 10-2001-0084174

(51) Int. Cl.[7] .............................................. G11C 16/04
(52) U.S. Cl. ............................ 365/185.17; 365/185.09; 365/185.11; 365/185.12; 365/185.22
(58) Field of Search ....................... 365/185.17, 185.07, 365/185.09, 185.11, 185.12, 185.22

(56) References Cited

U.S. PATENT DOCUMENTS

| | | | | |
|---|---|---|---|---|
| 5,596,526 A | * | 1/1997 | Assar et al. | 365/185.17 |
| 5,671,176 A | | 9/1997 | Jang et al. | |
| 5,687,121 A | * | 11/1997 | Lee et al. | 365/185.11 |
| 5,712,818 A | | 1/1998 | Lee et al. | |
| 6,487,116 B2 | * | 11/2002 | Khan et al. | 365/185.11 |
| 6,519,180 B2 | * | 2/2003 | Tran et al. | 365/185.03 |

* cited by examiner

Primary Examiner—Connie C. Yoha
(74) Attorney, Agent, or Firm—Marger Johnson & McCollom, P.C.

(57) ABSTRACT

A NAND-type flash memory device includes a plurality of row selectors each corresponding to memory blocks of each mat therein. Each of the row selectors selects a corresponding memory block in response to block selection information. A decoding circuit and a register are supplied to each of the row selectors. The decoding circuit generates a block selection signal in response to the block selection information, and the register stores an output of the decoding circuit when a latch signal of a corresponding mat is activated. According to the above row selection construction, all mats or a part of memory blocks can be selected at the same time.

5 Claims, 10 Drawing Sheets

NAND-TYPE FLASH MEMORY DEVICE WITH MULTI-PAGE PROGRAM, MULTI-PAGE READ, MULTI-BLOCK ERASE OPERATIONS

FIELD OF THE INVENTION

The present invention relates to a flash memory device and, more particularly, to a NAND-type flash memory device with a multi-page program operation, a multi-block erase operation, and a multi-page read operation.

BACKGROUND OF THE INVENTION

A NAND-type flash memory device such as a non-volatile memory device includes memory cells (or memory cell transistors). Each of the memory cell transistors includes a floating gate transistor having a source, drain, a floating gate, and a control gate. The memory cell transistor stores data therein by varying the amount of charges of the floating gate to store data therein. For example, a memory cell transistor is programmed by injecting electrons into a floating gate so that a threshold voltage becomes higher than a predetermined voltage. On the other hand, the memory cell transistor is erased by drawing electrons from the floating gate so that a threshold voltage becomes lower than a predetermined voltage. In a NAND-type flash memory device, a memory cell transistor is erased/programmed according to the Flower-Nordheim tunneling (F-N tunneling) effect, which is explained in U.S. Pat. No. 5,671,176 entitled "Semiconductor Memory Device Including Program Inhibit Capacitors And Method For Controlling Program-disturb Of Non-selected Memory Cells".

Figure 1:
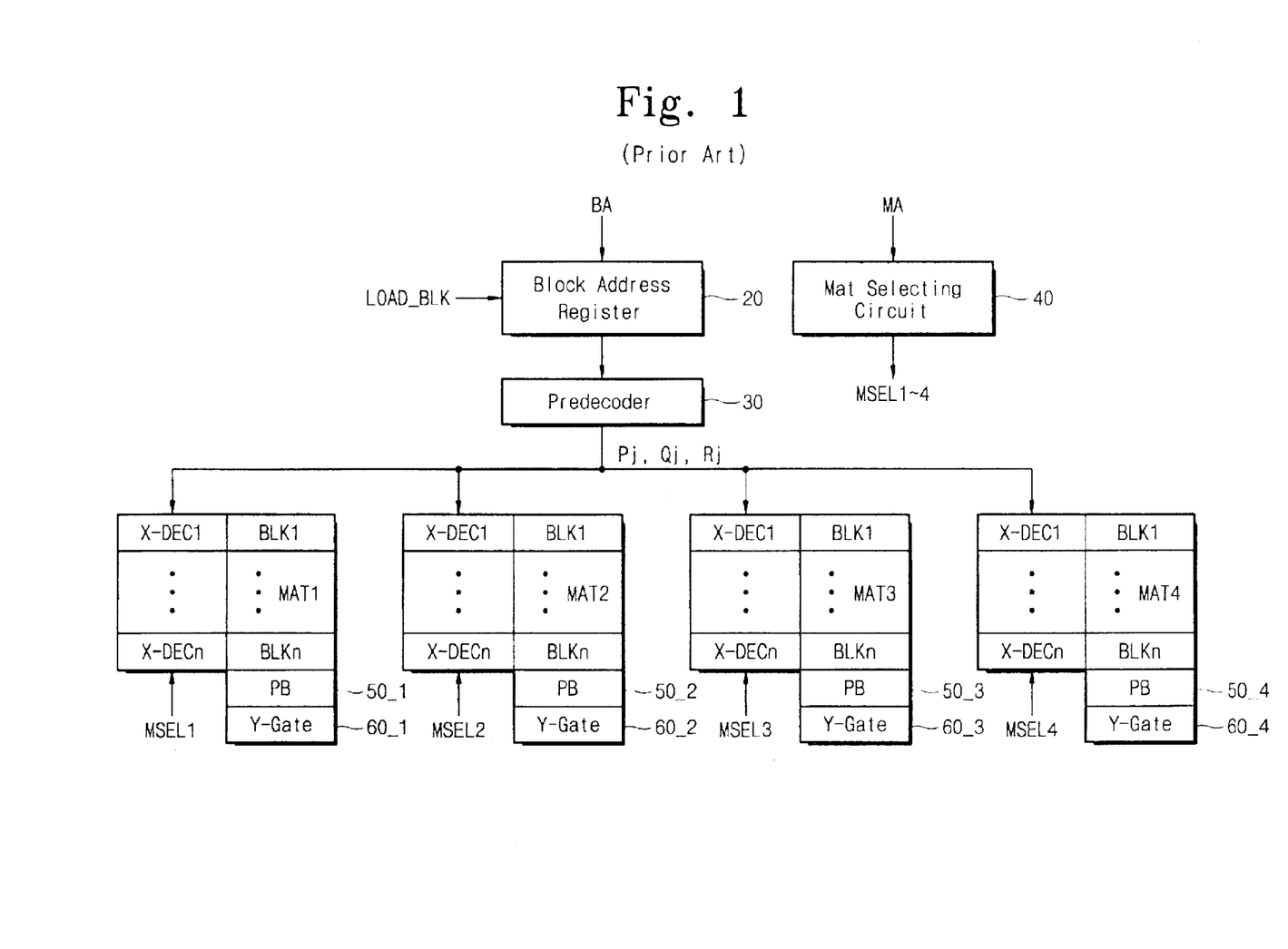
FIG. 1 is a block diagram of a conventional NAND-type flash memory device.

As illustrated in FIG. 1, a conventional NAND-type flash memory device includes a block address register 20, a predecoder 30, and a mat selecting circuit 40. The block address register 20 latches a block address BA in response to a control signal LOAD_BLK. The predecoder 30 decodes an output of the block address register 20 to output decoding signals Pj, Qj, and Rj. The mat selecting circuit 40 activates one of mat selecting signals MSEL1~MSEL4 in response to a mat address MA that is inputted from an external source.

Also the NAND-type flash memory device includes a memory cell array for storing information. The memory cell array is divided into a plurality of mats MATi (i=1~4) each having a plurality of rows or wordlines, a plurality of columns or bitlines, and a plurality of memory cells arranged in a matrix of the rows and the columns. The memory cells at the respective columns constitute a NAND string, and the memory cells at the respective rows constitute a page. Although not shown in the figure, the NAND string includes memory cells that are serially coupled between a string selection transistor and a ground selection transistor, as disclosed in the above-referenced U.S. Pat. No. 5,671,176.

To simplify the explanation, peripheral components associated with one mat (e.g., MAT 1) will now be explained hereinbelow. The other mats MAT2–MAT4 have the same construction as the mat MAT1 and will not be explained in further detail.

A NAND-type flash memory device includes a row selection circuit having a plurality of row selectors X-DEC1~X-DECn each corresponding to their memory blocks BLK1–BLKn of each mat. Each of the selectors X-DEC1~X-DECn transfers wordline voltages to rows or wordlines of a corresponding memory block in response to a mat selection signal MSELi and decoding signals Pj, Qj, an Rj from a predecoder. For example, the row selector X-DEC1 transfers wordline voltages to rows or wordlines of a corresponding memory block in response to a mat selection signal MSEL1 and the decoding signals Pj, Qj, and Rj. Although not shown in the figure, the wordlines voltages are supplied from a high voltage generation circuit.

A page buffer circuit 50_1 is coupled to columns or bitlines (not shown) extended through the corresponding mat MAT1, and includes page buffers each corresponding to their columns. Each of the page buffers acts as a sense amplifier, a latch circuit, and a write driver. For example, a page buffer senses data from memory cells of a selection page through bitlines in a read operation, and temporarily latches the sensed data. The page buffer temporarily latches data to be programmed to a selection page in a program operation, and transfers the latched data to bitlines. An exemplary page buffer is disclosed in U.S. Pat. No. 5,712,818 entitled "Data Loading Circuit For Parallel Program Of Nonvolatile Semiconductor Memory". A column pass gate circuit 60_1 partially selects columns of a corresponding mat, and couples page buffers of the selected columns to a data bus (not shown).

Figure 2:
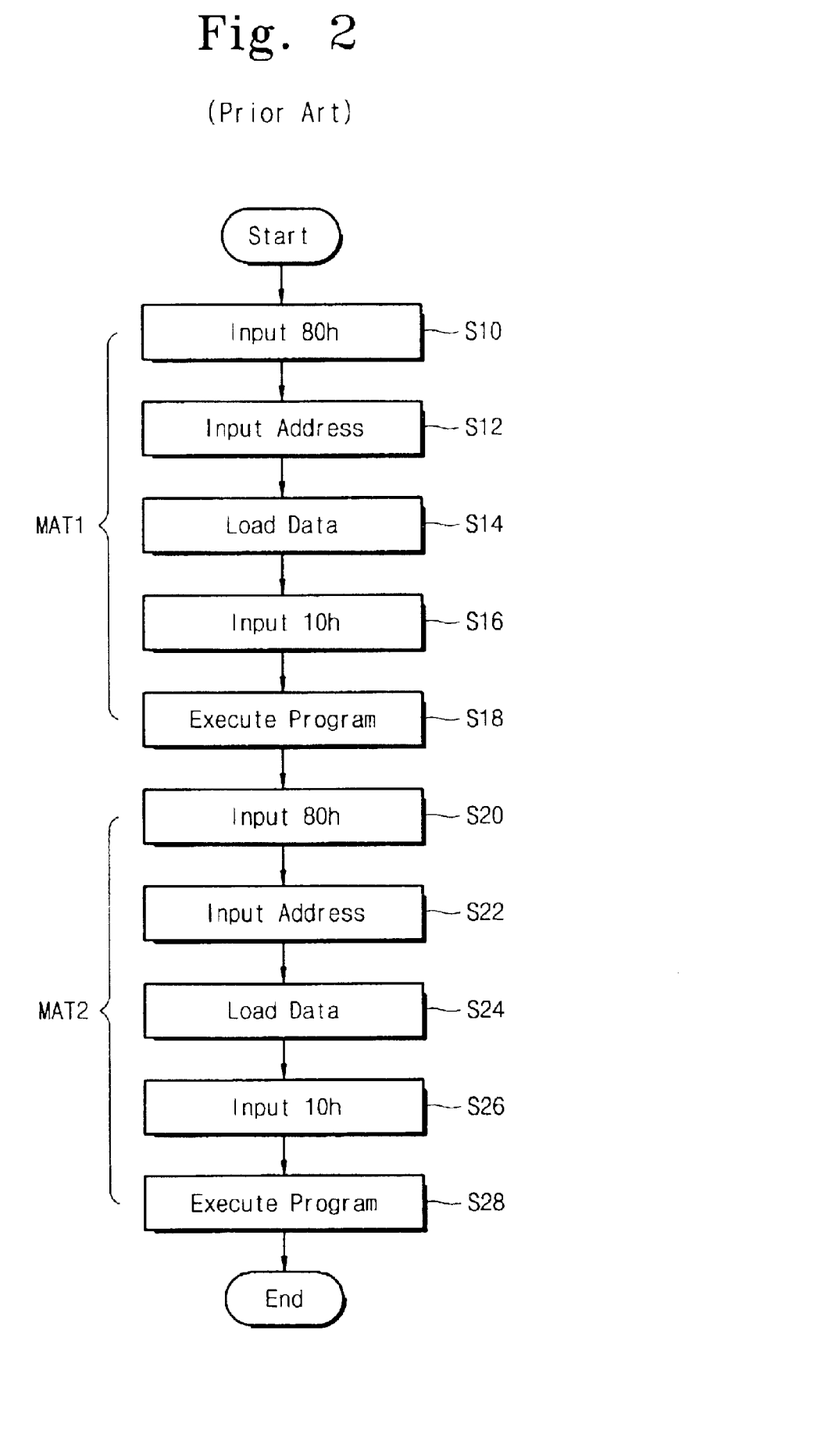
FIG. 2 is a flowchart for explaining a conventional programming method.

The NAND-type flash memory device shown in FIG. 1 iteratively carries out the same program operation in order to store page data in each mat. As shown in FIG. 2, after inputting a command 80h indicating the sequential data input (S10), an initial address is inputted (S12). Byte/word page data to be programmed to a mat (e.g., MAT1) selected according to an inputted address is sequentially loaded in page buffer circuit 50_1 through a column pass gate circuit 60_1 (S14). As a command 10h indicating the program execution is inputted (S16), the data loaded in the page buffer circuit 50_1 is to be programmed to the selected mat MAT1 (S18). The procedure (S10~S18) must be reiterated for programming each mat.

Similar to the program operation, read and erase operations must be reiterated for each mat unit. This leads to an undesirable decrease in an operation speed. Thus, what is needed is a new scheme to program/erase pages/memory blocks of mats at the same time.

SUMMARY OF THE INVENTION

In order to meet the above-mentioned necessity, the present invention provides a NAND-type flash memory device which carries out a multi-page program operation, a multi-page read operation, and a multi-block erase operation.

According to one aspect of the present invention, a NAND-type flash memory device comprise a plurality of mats, a plurality of row selectors, a plurality of page buffer circuits, a plurality of row selectors, a plurality of pass/fail check circuits, a plurality of reset signal generators, and a latch signal generator. Each of the mats includes a plurality of memory blocks each having a plurality of memory cells arranged in a matrix of rows and columns. Each of the row selectors corresponds to the memory blocks of the respective mats, and selects a corresponding memory block in response to block selection information. Each of the page buffer circuits corresponds to the mats, and senses data from a selected memory block of a corresponding mat through columns of a selected memory block and transfers data to be programmed to the columns of the selected memory block. Each of the column selectors corresponds to the mats, and partially selects the columns of the selected memory block. Each of the pass/fail check circuits corresponds to the mats, and determines whether data transferred from a corresponding buffer circuit through a column selector is pass data. Each of the reset signal generators corresponds to the mats, and generates a first reset signal of a corresponding mat when the transferred data is the pass data. The latch signal generator selects one of the mats in response to mat selection information.

Each of the row selectors includes a decoding circuit which generates a block selection signal in response to the block selection information, a register which stores an output of the decoding circuit when a latch signal of a corresponding mat is activated, a first switch which is coupled to a block wordline and transfers a high voltage to the block wordline when a value latched by the register indicates that a corresponding memory block is selected, a second switch which transfers wordline voltages to rows of a corresponding memory block in response to the high voltage on the block wordline, and a reset circuit which resets the register when the first signal is activated.

The NAND-type flash memory device further comprises a control logic for determining whether an externally applied command is a command indicating the input of sequential data and generating a second reset signal when the externally applied command is the command indicating the input of the sequential data. Each of the reset signal generators generates the first reset signal when the second rest signal is activated or when data from a corresponding page buffer circuit is pass data. The latch signal generator includes a pulse generator, for generating a pulse signal in response to a flag signal indicating an operating status of the memory device, and a plurality of decoders each corresponding to the mats and each generating a latch signal of a corresponding mat in response to the mat selection information when the pulse signal is generated. Each of the reset signal generators includes a pulse generator.

DESCRIPTION OF THE PREFERRED EMBODIMENT

A NAND-type flash memory device 100 according to the invention carries out a multi-page program operation, which means that data is programmed to one page of each mat, i.e., a plurality of pages are programmed at the same time. Here the page means a group of cells coupled to one wordline. Also the NAND-type flash memory device 100 carries out a multi-page read operation and a multi-block erase operation. The multi-page read operation means that data is read out from one page of each mat, i.e., a plurality of pages are read at the same time. The multi-block erase operation means that a memory block of each mat, i.e., a plurality of memory blocks, are erased at the same time. These operations are explained in detail later. The multi-page program operation, the multi-page read operation, and the multi-block erase operation cause program/erase/read times per bit to be shortened. That is, the NAND-type flash memory device 100 advantageously achieves high-speed operation.

Figure 3:
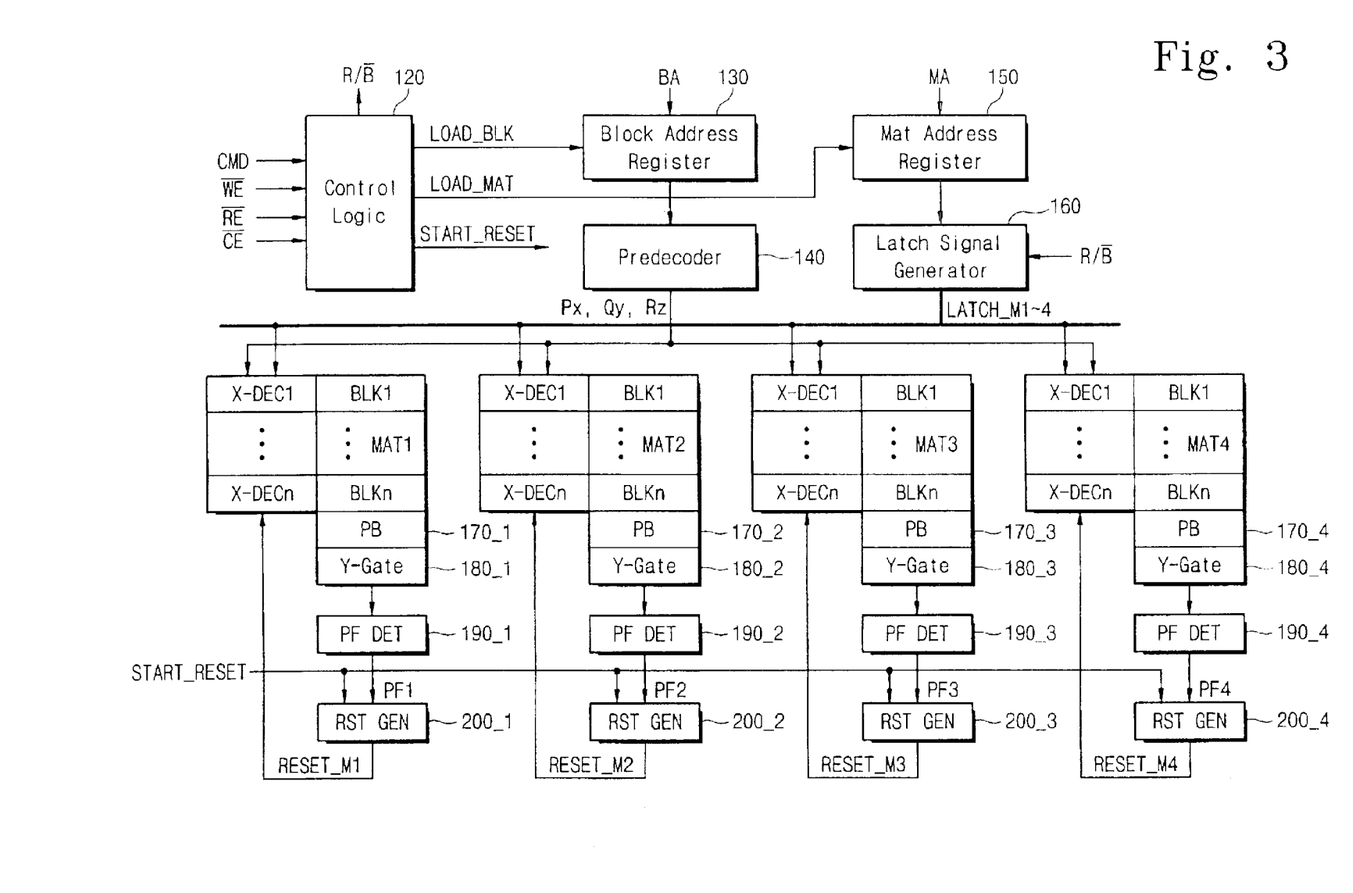
FIG. 3 is a block diagram of a NAND-type flash memory device according to the present invention.

Referring to FIG. 3, a NAND-type flash memory device according to the invention includes a memory cell array acting as a data storage area. The memory cell array is divided into a plurality of mats MATi (i=1~4) each having a plurality of memory blocks BLK0$n$–BLKn, in which same numerals denote same memory blocks of each mat. Although not shown in the figure, each of the memory blocks has a plurality of rows or wordlines, a plurality of columns or bitlines, and a plurality of memory cells arranged in a matrix of rows and columns. The memory cells at the respective columns constitute a string (see FIG. 8), and the memory cells at the respective rows constitute a page.

Figure 4:
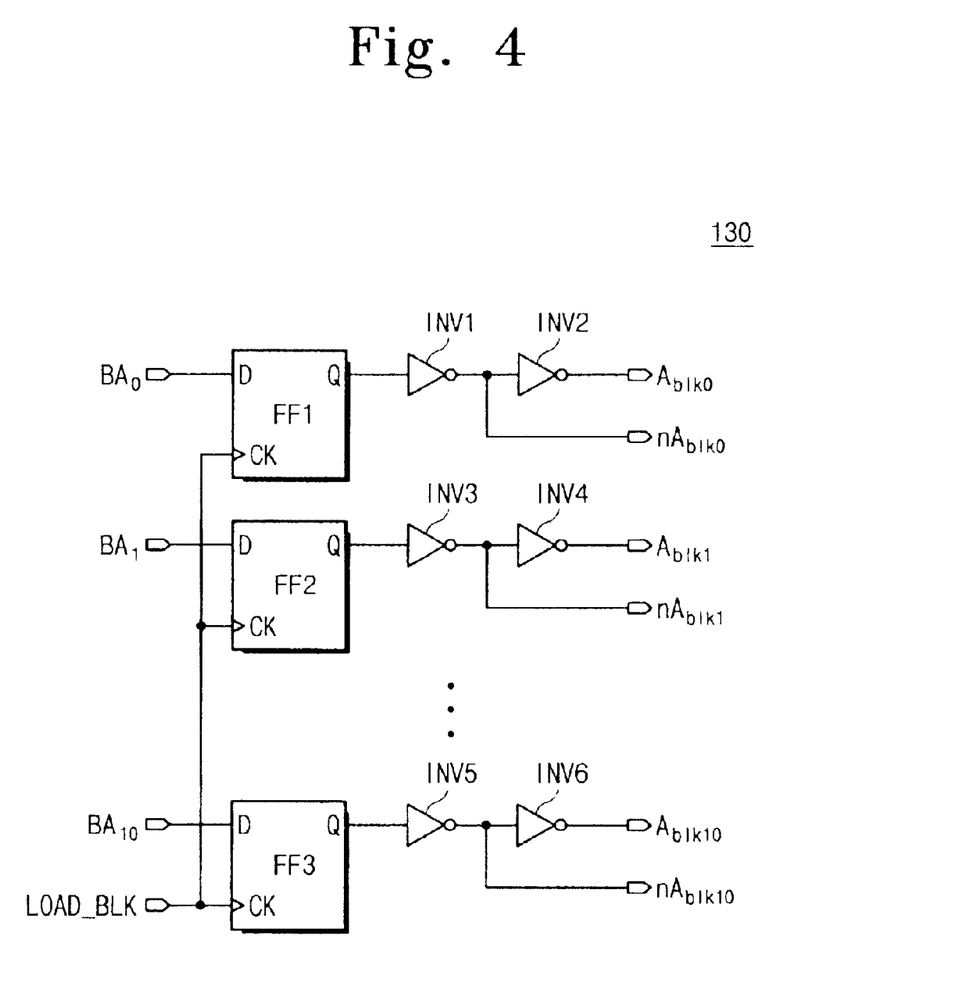
FIG. 4 illustrates a preferred embodiment of a block address register shown in FIG. 3.

The NAND-type flash memory device 100 further includes a control logic 120, a block address register 130, a predecoder 140, a mat address register 150, and a latch signal generator 160. The control logic 120 controls general operations of the NAND flash memory device 100, and generates control signals R/$\overline{B}$, LOAD_BLK, LOAD_MAT, and START_RESET in response to a command CMD and external signals $\overline{CE}$, $\overline{RE}$, and $\overline{WE}$. The external signals $\overline{CE}$, $\overline{RE}$, and $\overline{WE}$ are a chip enable signal, a read enable signal, and a write enable signal, respectively. The block address register 130 receives a block address BA in response to a control signal LOAD_BLK, and has a plurality of flip-flops FF1–FF3 and a plurality of inverters INV1–INV6, which are coupled as shown in FIG. 4. Each of the flip-flops FF1–FF3 stores corresponding block address signals BA0–BA10 in response to a low-to-high transition of the control signal LOAD_BLK, and outputs internal block address signals Ablk0–Ablk10 and nAblk0–nAblk10.

Figure 5:
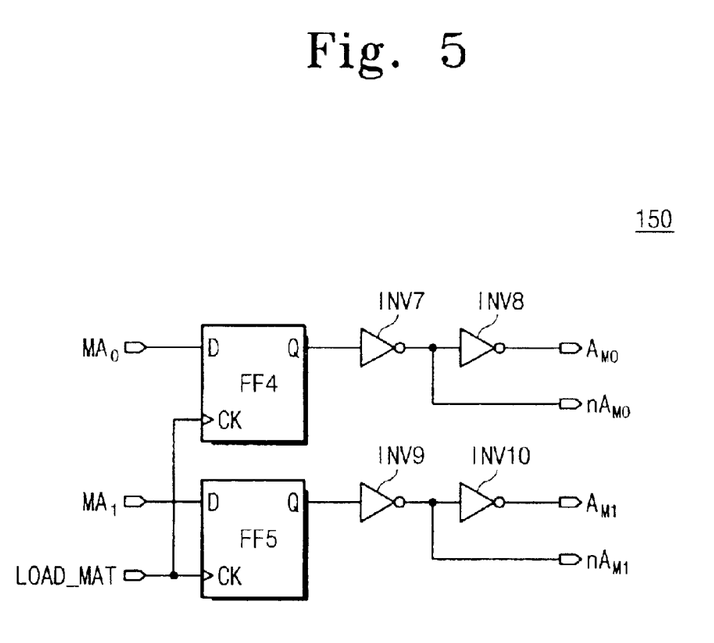
FIG. 5 illustrates a preferred embodiment of a mat address register shown in FIG. 3.

The mat address register 150 receives a mat address MA in response to a control signal LOAD_MAT, and has flip-flops FF4 and FF5 and inverters INV7–INV10, which are coupled as shown in FIG. 5. Each of the flip-flops FF4 and FF5 stores corresponding mat address signals MA0 and MA1 in response to a low-to-high transition of the control signal LOAD_MAT, and outputs internal mat address signals AM0, AM1, nAM0, and nAM1.

Figure 6:
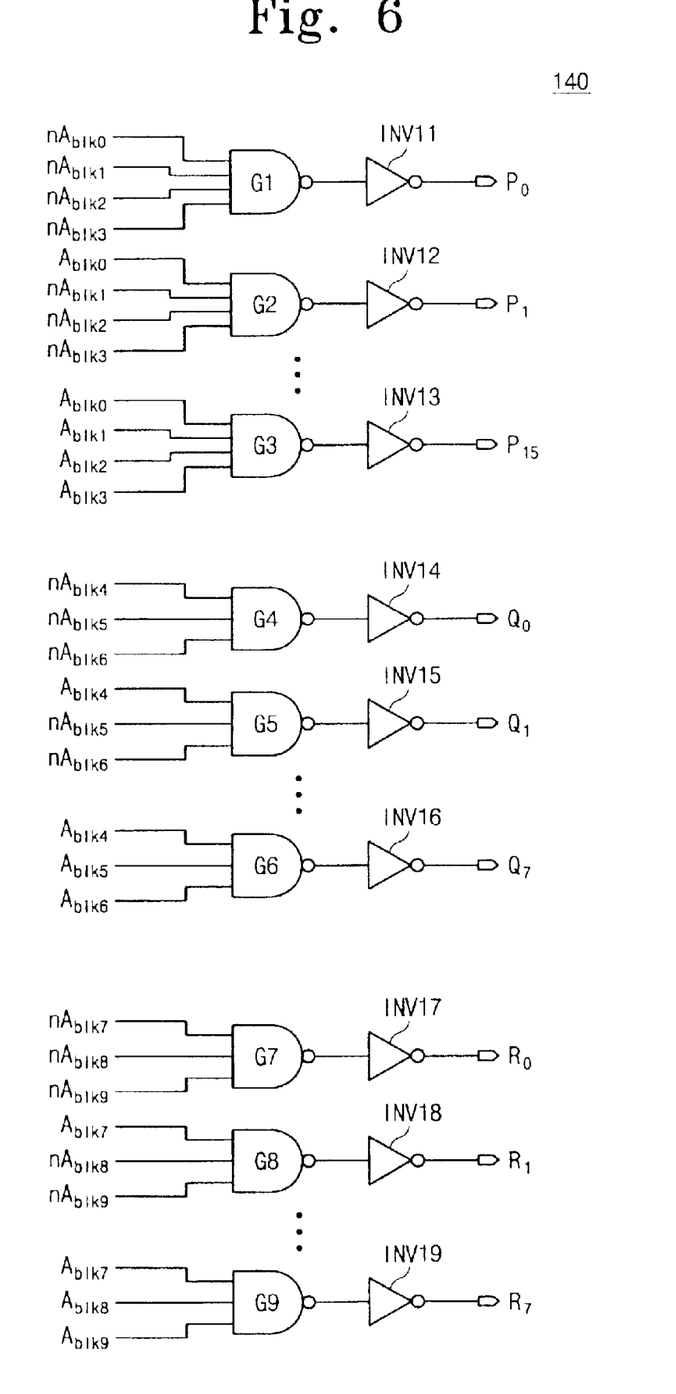
FIG. 6 illustrates a preferred embodiment of a predecoder shown in FIG. 3.

The predecoder 140 decodes an output of the block address register 130 to generate decoding signals Px, Qy, and Rz. For example, the predecoder 140 has a plurality of gates G1–G9 and a plurality of inverters INV11–INV19 each corresponding to the gates G1–G9, which are coupled as shown in FIG. 6. The predecoder 140 decodes output signals Ablk0–Ablk9 and nAblk0–nAblk9 of the block address register 130 to generate decoding signals P0–P15, Q0–Q7, and R0–R7. A predecoder 140 shown in FIG. 6 is an embodiment illustrating the case where one mat comprises 1024 memory blocks.

Figure 7:
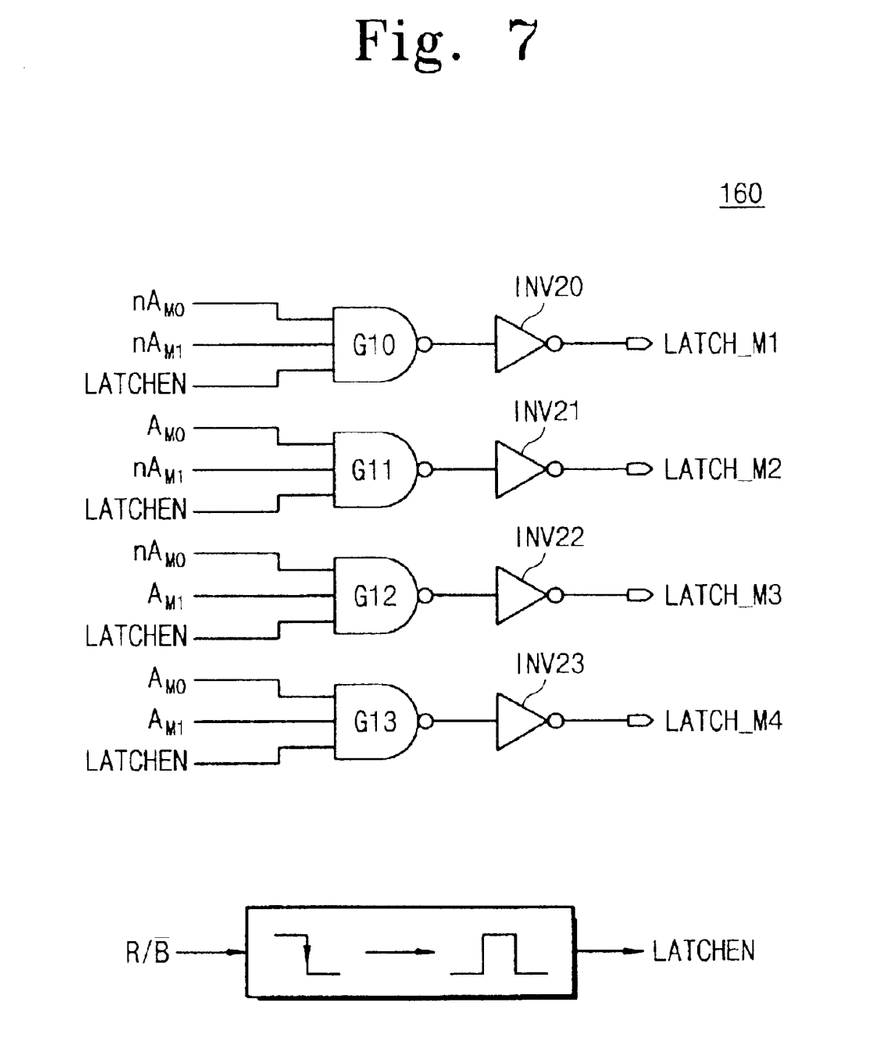
FIG. 7 illustrates a preferred embodiment of a latch signal generator shown in FIG. 3.

Returning to FIG. 3, the latch signal generator 160 outputs latch signals LATCH_M1~LATCH_M4 (LATCH_M1~4) in response to an output of the mat address register 150 and a flag signal R/$\overline{B}$ from the control logic 120. The latch signal generator 160 has a pulse generator 162, four NAND gates G10–G13, and four inverters INV20–INV23, which are coupled as shown in FIG. 7. The pulse generator 162 generates a pulse signal LATCHEN in response to a high-to-low transition of the flag signal R/B indicating an operating status of the NAND flash memory device. One NAND gate and one inverter constitute a signal generator, which acts as a decoding circuit. For example, the NAND gate G10 and the inverter INV20 decode address signals nAM0 and nAM1 when the pulse signal LATCHEN is high, generating a latch signal LATCH_M1 applied to row selectors X-DEC1~X-DECn of the mat MAT1. Here the term "row selector" has the same meaning as a block decoder or a block selector.

The NAND-type flash memory device 100 further includes a row selection circuit having row selectors each corresponding to the memory blocks BLK1–BLKn of the respective mats MAT1–MAT4, as shown in FIG. 3. The row selector selects a corresponding memory block in response to output signals of the predecoder 140 and a corresponding latch signal generated from the latch signal generator 160. Also the row selector transfers wordline voltages needed in each operation mode to rows or wordlines of a selected memory block, and includes a register for temporarily storing block selection information. This is explained in detail below.

The NAND-type flash memory device 100 further includes a page buffer circuit, a column pass gate circuit, a pass/fail check circuit, and a reset signal generation circuit. For the sake of brevity, peripheral components associated with one mat (e.g., MAT1) will be described hereinbelow. Peripheral components associated with the other mats MAT2–MAT4 are of the same construction as the mat MAT1 and will not be described in further detail.

Referring still to FIG. 3, a page buffer circuit 170_1 includes page buffers that are coupled to columns or bitlines (not shown) extended through the mat MAT1. The page buffers correspond to the columns. Each of the page buffers senses data from memory cells of a selection page through bitlines in a read operation and temporarily latches the sensed data. A page buffer temporarily latches data to be programmed to a selection page in a read operation and transfers the latched data to bitlines. The column pass gate circuit 180_1 (Y-GATE) partially selects columns of a corresponding mat MAT1. The pass/fail check circuit 190_1 (PF DET) receives latched data of selected page buffers through the column pass gate circuit 180_1 and determines whether the received data is program/erase pass data in program/erase verify operations. An output signal PF1 of the pass/fail check circuit 190_1 is finally activated when all data of the selected page is pass data.

Figure 10:
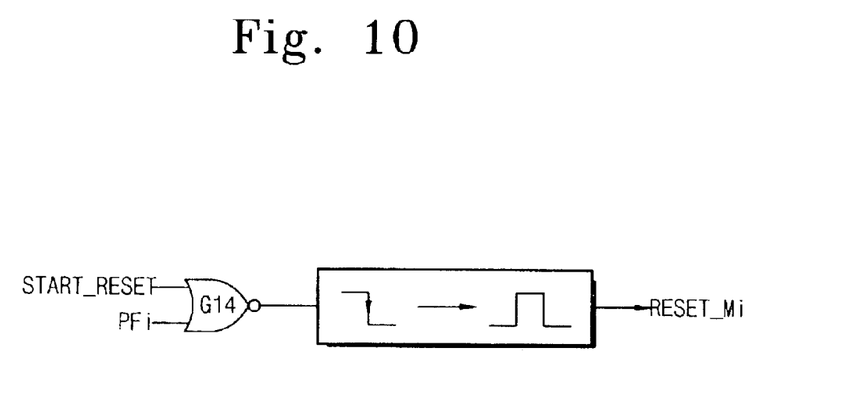
FIG. 10 illustrates a preferred embodiment of each reset signal generator shown in FIG. 3.

The reset signal generation circuit 200_1 receives the output signal PF1 of the pass/fail check circuit 190_1 and a reset signal START_RESET from the control logic 120, and activates a reset signal RESET_M1 when one of the inputted signals PF1 and START_RESET is activated. The reset signal RESET_M1 is supplied in common to the row selectors X-DEC0~X-DECn of the mat MAT1. The reset signal generation circuit 200_1 has a NOR gate G14 for receiving the signals START_RESET and PFi and a pulse generator for generating a signal RESET_M1 in response to an output of the NOR gate G14, as shown in FIG. 10.

Figure 8:
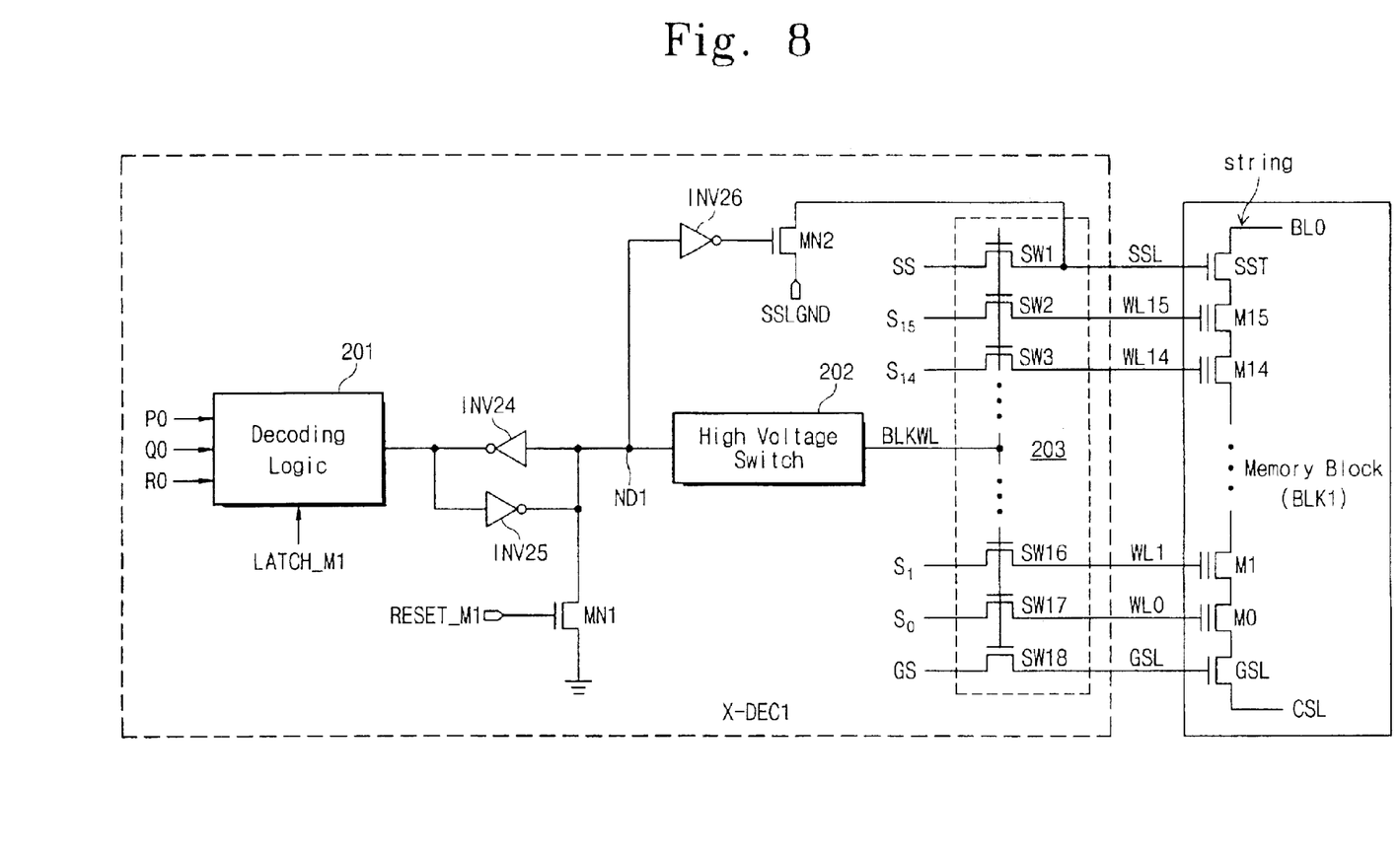
FIG. 8 illustrates a preferred embodiment of a row selector shown in FIG. 3.

Referring to FIG. 8, a row selector includes a decoding logic 201, inverters INV24, INV25, and INV26, NMOS transistors MN1 and MN2, a high voltage switch 202, and a switch circuit 203. The row selector is a row selector corresponding to a memory block BLK1 of the first mat MAT1. The other row selectors have the same construction as that shown in FIG. 8 and will not be described in further detail.

The decoding logic 201 decodes block address signals P0, Q0, and R0. The decoding result is outputted when a latch signal LATCH_M1 becomes active high. The inverters INV24 and INV25 constitute a latch, or register, and temporarily store an output of the decoding logic 201. The NMOS transistor MN1 acts as a reset circuit for initializing the latch of the inverters INV24/INV25 when the reset signal RESET_M1 becomes active high. As a result of initialization, an output of the latch becomes low. When the output of the latch is low, the high voltage switch 202 becomes active. The high voltage switch 202 transfers a high voltage to a block wordline BLKWL in response to a latch output signal of a high level. Here the high voltage is higher than a power supply voltage and is variable in accordance with each operation mode.

As a high voltage is applied to the block wordline BLKWL (or when a corresponding memory block is selected), the switch circuit 203 electrically connects a string selection line SSL, wordlines WL15–WL0, and a ground selection line GSL to selection signal lines SS, S15–S0, and GS, respectively. On the other hand, when the high voltage switch 202 becomes inactive (or a corresponding memory block is unselected), the switch circuit 203 electrically isolates the string selection line SSL, the wordlines WL15–WL0, and the ground selection line GSL from the selection signal lines SS, S15–S0, and GS. The switch circuit 203 includes a plurality of pass transistors SW1–SW18 whose gates are commonly coupled to the block wordline BLKWL. In a read operation, one of the selection signals S15–S0 has a ground voltage and the others have a read voltage. In a program operation, one of the selection signals S15–S0 has a program voltage and the others have a pass voltage.

An NMOS transistor MN2 is coupled between a terminal SSLGND and a string selection line SSL and is turned off according to an output signal of the inverter INV26. The terminal SSLGND has a ground voltage in program/read operations, and has a power supply voltage in an erase operation. The NMOS transistor MN2 prevents a string selection line SSL of an unselected memory block from floating during program/read operations and supplies a ground voltage to the string selection line SSL of the unselected memory block during program/read operations.

Figure 9:
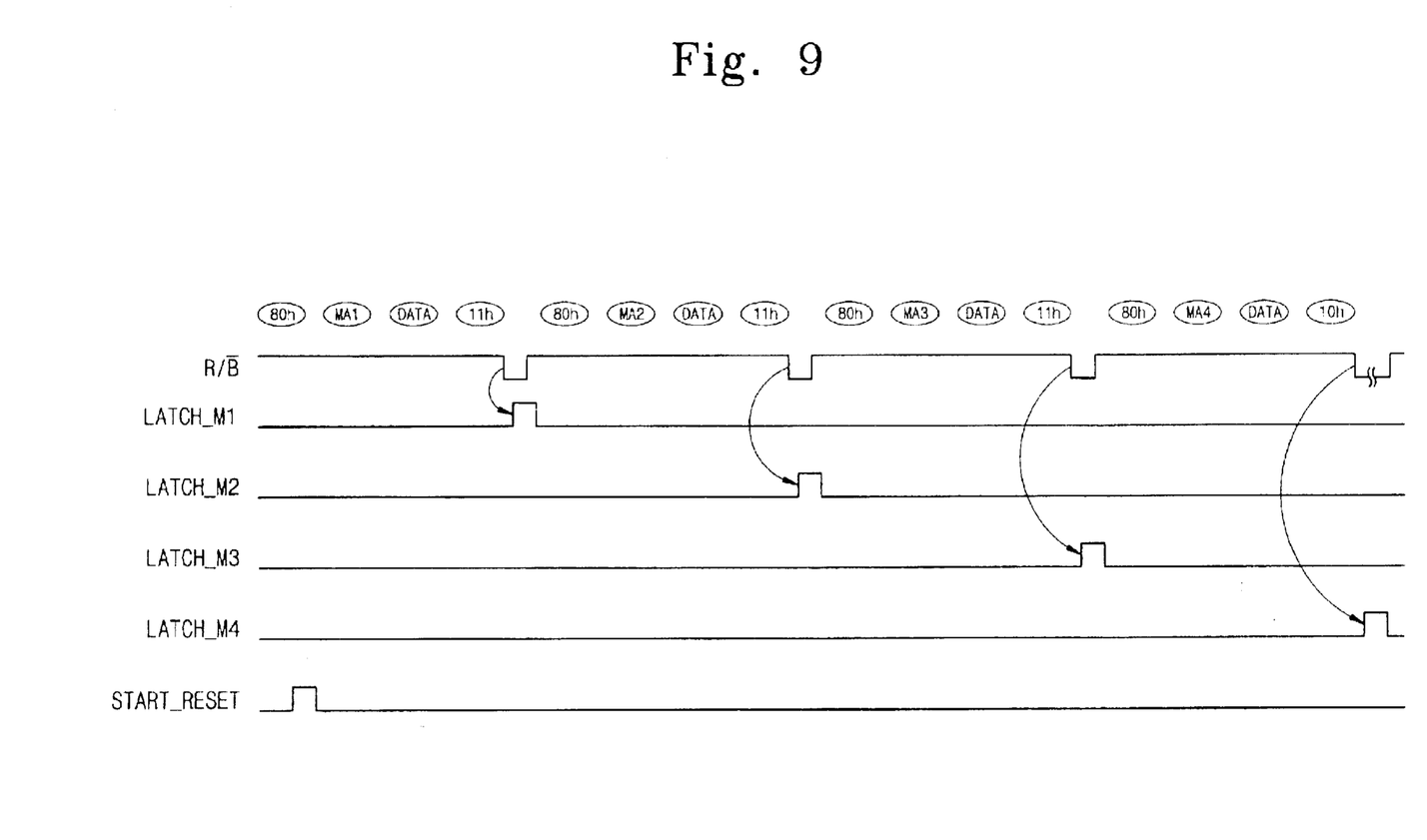
FIG. 9 is a timing diagram for explaining a multi-page program operation according to the present invention.

FIG. 9 is a timing diagram for explaining a multi-page program method according to the invention. A multi-page program operation of the NAND-type flash memory device according to the invention will now be described more fully hereinafter with reference to the accompanying drawings.

In order to carry out a multi-page program operation, a command 80h indicating the input of sequential data is applied to the NAND-type flash memory device 100. The control logic 120 generates a control signal START_RESET in response to a firstly inputted 80h command. Reset signal generation circuits 200_1~200_4 corresponding to the mats MAT1NMAT4 generate reset signals RESET_M1~RESET_M4, respectively, in response to the control signal START_RESET. This leads to initialization of latches (or registers) in the row selectors X-DEC1~X-DECn of the respective mats MAT1~MAT4. As a result, an output of the respective latches becomes low.

It is well known that an initial address and data are sequentially inputted to the NAND-type flash memory device 100 after the 80h command is inputted. More specifically, the block address register 130 receives a block address BA from the initial address in response to the control signal LOAD_BLK from the control logic 120 and receives a mat address MA from the initial address in response to the control signal LOAD_MAT from the control logic 120. The predecoder 140 decodes an output of the block address register 130 to output decoding signals Px, Qy, and Rz for selecting a memory block of a selected mat. The decoding signals Px, Qy, and Rz are supplied in common to each row selector. Of the memory blocks BLK1–BLKn of the selected mat (e.g., MAT1), one memory block (e.g., X-DEC1) is selected according to an output of the predecoder 140. A decoding logic 201 of a row selector 201 corresponding to the selected memory block BLK1 decodes decoding signals P0, Q0, and R0. In this case, an output of the decoding logic 201 is not transferred to a latch because a latch signal LATCH_M1 is not activated.

After the address is inputted, byte/word data to be programmed are sequentially loaded in a page buffer circuit 170_1 through a column pass gate circuit 180_1. If the data to be programmed are all loaded therein, a command 11h is inputted which indicates that inputting sequential data is completed. The control logic 120 outputs a flag signal RI B having a low-to-high transition in response to an input of the command 11h. The latch signal generator 160 receives an output of the mat address register 150 to generate a latch signal LATCH_M1 synchronized with the low-to-high transition of the flag signal R/$\overline{B}$. When the latch signal LATCH_M1 is activated, a low level signal outputted from the decoding logic 201 of a row selector X-DEC1 corresponding to a selected memory block is stored in the latch INV24/INV25. As described above, when the output signal of the latch INV24/INV25 is high, the high voltage switch 202 transfers a high voltage to the block wordline BLKWL. Nonetheless, program and pass voltages are not applied to the selection signal lines S15–S0.

The block selection information on a selection memory block of a currently selected mat is stored in the latch INV24 and INV25 of the row selector X-DEC0. The stored information is maintained until the reset signal RESET_M1 becomes active high. In the row selectors corresponding to unselected memory blocks of the selected mat MAT1, a node ND1 (referring to FIG. 8) becomes low because an output of the decoding logic 201 is high. Thus, the NMOS transistor MN2 is turned on to apply a ground voltage to the string section line SSL of the respective unselected memory blocks.

Afterwards, the 80h command is re-applied to the NAND flash memory device 100. In this case, the control signal START_RESET is not generated such that the previously inputted block selection information is maintained. After inputting the second 80h command, the address and data are sequentially inputted. With the exception that mat address information for selecting the second mat MAT2 is included in an address supplied after inputting the first command 80h, the series of operations proceeds as in the case with the first 80h command, as described above. Similarly, the block selection information is stored in the latch INV24 and INV25 of a row selector (e.g., X-DEC1) corresponding to a selection memory block of the second mat MAT2. In this same manner, the block selection information is stored in a latch of row selector of the other respective mats.

As illustrated in FIG. 9, when a 10h command indicating program execution is inputted, a program voltage is applied to a selected one of the selection signal lines S15–S0 and a pass voltage is applied to the other lines. Concurrently, data bits loaded in the respective page buffer circuits 170_1~170_4 are transferred to columns of the corresponding respective mats. Under this condition, memory cells of the selected page will be programmed by a programming method well known in the art. After a predetermined time, a program verify operation is performed to determine whether the memory cells of the selected page are normally programmed.

For the sake of brevity, the program verify operation will be described in association with only the first mat MAT1. In order to verify the program, states of the memory cells of the selected page are sensed through the page buffer circuit 170_1. The sensed data is transferred to the pass/fail check circuit 190_1 through the column pass gate circuit 180_1. The pass/fail check circuit 190_1 activates a pass/fail signal PF1 when the memory cells of the selected page of the mat MAT1 are normally programmed. The reset signal generation circuit 200_1 generates a reset signal RESET_M1 in response to the activated signal PF1. This leads to initialization of the latches in the row selectors X-DEC1~X-DECn of the mat MAT1. As a result, a high voltage switch is activated, which means that the program and pass voltages are not transferred to wordlines of the selected memory block of the mat MAT1.

Although data is concurrently written in selected pages of the mats MAT1–MAT4, program operations for the selected pages of the mats MAT1–MAT4 are not concurrently completed. For that reason, wordline voltages (or program and pass voltages) undesirably would be continuously applied to rows or wordlines of a selected memory block that is completely programmed. This results in an undesirable program disturbance of the completely programmed memory block. Accordingly, the reset signal generation circuit (e.g., 200_1) initializes a latch in each row decoder of a corresponding mat according to an output of the pass/fail check circuit (e.g., 190_1) so that the wordline voltage will not be applied to the completely programmed memory block.

In the NAND-type flash memory device according to the invention, it is will be understood that similar to the multi-page program operation, a multi-page read operation or a multi-block erase operation may be carried out after an address and a command for selecting each mat are iteratively inputted. Therefore, the multi-page read operation and the multi-block erase operation are not explained in further detail.

As explained so far, by constructing a register for storing block selection information in each row decoder, one page or one memory block per mat is selected to simultaneously program/read data to/from a plurality of pages (or simultaneously erase a plurality of memory blocks). This makes it possible to reduce program/erase times when a plurality of pages are programmed (or a plurality of memory blocks are erased). Moreover, a read time can be reduced when a plurality of pages are accessed.

While the present invention has been described in detail with regard to preferred embodiments and drawings of the invention, it will be apparent to those skilled in the art that various modifications and alterations may be made without departing from the spirit and scope of the invention. For example, a latch signal LATCH M outputted from a latch signal generation circuit may be activated at any time after inputting an address instead of a high-to-low transition of a flag signal R/$\overline{B}$. Other suitable alternatives are contemplated, and are within the spirit and scope of the invention.

What is claimed is:

1. A NAND-type flash memory device comprising:
a plurality of mats each including a plurality of memory blocks,
wherein each of the memory blocks includes a plurality of memory cells arranged in a matrix of rows and columns;
a plurality of row selectors each corresponding to the memory blocks of the respective mats and each selecting a corresponding memory block in response to block selection information;
a plurality of page buffer circuits corresponding to the plurality of mats and each sensing data from a selected memory block of a corresponding mat through columns of a selected memory block and transferring data to be programmed to the columns of the selected memory block;
a plurality of column selectors corresponding to the plurality of mats and each partially selecting the columns of the selected memory block;
a plurality of pass/fail check circuits corresponding to the plurality of mats and each determining whether data transferred from a corresponding buffer circuit through a column selector is pass data;
a plurality of reset signal generators corresponding to the plurality of mats and generating a first reset signal of a corresponding mat when the transferred data is the pass data; and
a latch signal generator for selecting one of the mats in response to mat selection information,
wherein each of the row selectors includes:
a decoding circuit for generating a block selection signal in response to the block selection information;
a register for storing an output of the decoding circuit when a latch signal of a corresponding mat is activated;
a first switch for transferring a high voltage to a block wordline when a value latched by the register indicates that a corresponding memory block is selected, the first switch being coupled to the block wordline;
a second switch for transferring wordline voltages to rows of a corresponding memory block in response to the high voltage on the block wordline; and
a reset circuit for resetting the register when the first reset signal is activated.

2. The NAND-type flash memory device of claim 1, further comprising a control logic for determining whether an externally applied command is a command indicating the input of sequential data and generating a second reset signal when the externally applied command is the command indicating the input of the sequential data.

3. The NAND-type flash memory device of claim 1, wherein each of the reset signal generators generates the first reset signal when the second reset signal is activated or when data from a corresponding page buffer circuit is pass data.

4. The NAND-type flash memory device of claim 1, wherein the latch signal generator includes:
a pulse generator for generating a pulse signal in response to a flag signal indicating an operating status of the memory device; and
a plurality of decoders corresponding to the plurality of mats, each decoder generating a latch signal of a corresponding mat in response to the mat selection information when the pulse signal is generated.

5. The NAND-type flash memory device of claim 1, wherein each of the reset signal generators includes a pulse generator.

* * * * *

UNITED STATES PATENT AND TRADEMARK OFFICE
CERTIFICATE OF CORRECTION

PATENT NO. : 6,735,116 B2
DATED : May 11, 2004
INVENTOR(S) : Lee et al.

It is certified that error appears in the above-identified patent and that said Letters Patent is hereby corrected as shown below:

Title page,
Item [75], Inventors, "Young-ho Lim" should read -- Young-Ho Lim --.

Column 5,
Line 4, "signal R/B indicating" should read -- signal R/$\overline{B}$ indicating --.

Column 7,
Line 23, "signal RI B having" should read -- signal R/$\overline{B}$ having --.

Column 8,
Line 63, "LATCH M outputted" should read -- LATCH_M outputted --.

Signed and Sealed this

Twenty-second Day of March, 2005

JON W. DUDAS
*Director of the United States Patent and Trademark Office*